United States Patent
Duyar et al.

(10) Patent No.: US 6,393,373 B1
(45) Date of Patent: May 21, 2002

(54) MODEL-BASED FAULT DETECTION SYSTEM FOR ELECTRIC MOTORS

(75) Inventors: Ahmet Duyar, 4201 North Ocean Blvd., Suite 206, Boca Raton, FL (US) 33431; Evren Albas, Istanbul (TR); Osman Tugrul Durakbasa, Istanbul (TR); A. Hakan Serafettinoglu, Istanbul (TR)

(73) Assignees: Arcelik, A.S.; Ahmet Duyar, both of (TR)

( * ) Notice: Subject to any disclaimer, the term of this patent is extended or adjusted under 35 U.S.C. 154(b) by 0 days.

(21) Appl. No.: 09/249,588

(22) Filed: Feb. 11, 1999

Related U.S. Application Data

(62) Division of application No. 08/672,319, filed on Jun. 28, 1996, now Pat. No. 6,014,598.

(51) Int. Cl.⁷ .............................................. G06F 17/00
(52) U.S. Cl. .................... 702/115; 702/58; 702/185; 318/565; 318/568.24; 318/490; 703/4
(58) Field of Search ............................. 702/115, 33–35, 702/41, 42, 57–59, 64, 65, 81–84, 108, 112, 113, 116, 123–126, 142, 145–148, 179, 181–185, 189, 193, 196, 56, FOR 135, FOR 137, FOR 139, FOR 150, FOR 151, FOR 113, FOR 114, FOR 170, FOR 171, FOR 103–FOR 106, FOR 123–FOR 126; 701/29–31, 34, 35, 59, 63, 99; 340/825.06, 825.16, 438, 635, 514, 515; 703/2–4, 6–8; 706/905, 913, 920; 700/21, 26, 23, 24–33, 39, 80, 81, 109, 110, 280, 287, 290, 292–294, 304, 69; 361/23, 24, 30, 31, 33; 318/563–565, 568.29, 490; 388/903, 907.5, 909; 73/116, 117.1–117.3, 119 R, 488, 489, 492, 495, 496

(56) References Cited

U.S. PATENT DOCUMENTS

| | | | | |
|---|---|---|---|---|
| 4,696,167 A | * | 9/1987 | Matsui et al. | 700/31 |
| 4,840,245 A | * | 6/1989 | Kamei et al. | 700/69 |
| 5,214,596 A | * | 5/1993 | Müller | 700/30 |

OTHER PUBLICATIONS

A. Duyar and W. Merrill, "Fault Diagnosis for the Space Shuttle Main Engine," Journal of Guidance, Control, and Dynamics, AIAA (Washington, D.C.), vol. 15, (No. 2), pp. 384–389, Mar./Apr. 1992.*

Vasfi Eldem and Ahmet Duyar, "Parametrization of Multivariable Systems Using Output Injections: Alpha Canonical Forms," Automatica, Pergamon Press, Ltd. (Great Britain), vol. 29 (No. 4), pp. 1127–1131, 1993. (No month).*

Duyar et al., "State Space Representation of the Open–Loop Dynamics of the Space Shuttle Main Engine," Journal of Dynamic Systems, Measurement and Control, pp. 684–690, Dec. 1991.*

* cited by examiner

Primary Examiner—Hal Wachsman
(74) Attorney, Agent, or Firm—Craig E. Shinners

(57) ABSTRACT

The present invention relates to fault detection in a large population of motors of a common motor type. Initially, a plurality of motors of a common motor type is tested to obtain a first residual based on selected measured operating parameters. A second residual is then developed for each individual motor comprising the plurality of motors. If the difference between the first and second residuals exceeds a selected threshold, the motor generating the second residual is defective and removed from the plurality of motors and the threshold is adjusted to reflect the removal of the defective motor from the plurality of motors. The first residual may be used to monitor the operation of motors not included in the original plurality of motors to detect impending failure.

14 Claims, 11 Drawing Sheets

MODEL-BASED FAULT DETECTION SYSTEM FOR ELECTRIC MOTORS

This is a divisional of application Ser. No. 08/672,319 filed Jun. 28, 1996, now U.S. Pat. No. 6,014,598.

BACKGROUND OF THE INVENTION

The present invention relates to electric motors. More particularly, the present invention relates to a method and apparatus for condition monitoring and predictive maintenance of electric motors.

Electric motors are widely used in industrial equipment and processes where such motors are used to move goods along an assembly line from one work station to another or as a power source for power tools used by assemblers. Examples include air compressor that provide compressed air to power screw drivers, paint sprayers and other small hand-held appliances. Larger horsepower electrical motors maintain environmental control by cooling, heating and transporting air through the heating and cooling system in buildings and vehicles. In the home and office environment, electric motors are used in appliances ranging from computers to vacuum cleaners. As is generally known, such appliances constitute a major source of noise and vibration. Therefore, ever increasing demand from the market for quieter and vibration free motors can only be fulfilled by the design and production of fault free and quieter motors.

In the manufacturing environment, unexpected failure of the motor is both undesirable and costly. In the industrial setting, motor failure could have significant financial impact if an assembly line is shut down during the time it takes to repair or replace the motor. Further, in some manufacturing processes, such as in a semiconductor fabrication facility, failure of a critical motor could result in damage to the product if control over the environment is compromised.

Accordingly, there is a growing demand to improve the reliability of electric motors in general and, especially in industrial applications, detect impending faults so the motors can be repaired or replaced during routine maintenance rather than after failure has occurred. It is also desirable to improve reliability of electric motors through improved quality control monitoring during manufacture of the electric motors. It is further desirable to detect motor faults prior to catastrophic failure through performance monitoring during operation.

Recently, fault detection and diagnosis (FDD) methods have been developed that compare the output signals of complex systems with the output signal obtained from a mathematical model of the fault free system. The comparison of these signals is quantified in terms of a "residual" which is the difference between the two signals. Analysis of the residuals is carried out to determine the type of the fault. This analysis includes statistical methods to compare the residuals with a database of residuals for systems with known faults.

Until recently it has been difficult to obtain accurate, real-time models for multivariable systems, that is, systems with more than one inputs and/or one outputs. If the model of the system is not accurate, the residuals will contain modeling errors that are very difficult to separate from the effect of actual faults.

Another shortcoming of such FDD methods relates to the difficulty in generating a data base for statistical testing of residuals to classify faults. Developing such a database requires a priori information about all possible faults and the effect each such fault has on the residuals. Accordingly, a period of time is required to monitor defective and normal equipment and to develop a data base which contains fault signatures for fault classification purposes. This process is both costly and time consuming. Also, the data base must also meet the specific requirements of a particular FDD scheme.

Since, mechanical faults are the result of vibration, detection and analysis of vibration is a common element of many prior art detection schemes. Such techniques require development of a library showing previously experienced motor vibration patterns which are correlated with the detected fault.

A common disadvantage of mechanical fault detection is that the scheme requires a-priori information about the fault signature in order to correlate the actual fault with the detected signature. Such correlation requires development of an extensive database and a laborious analysis and a level of expertise about the motor.

Another drawback of mechanical fault detection arises from the difficulty associated with reproducing the measurements. For example, vibration measurements using an accelerometer are highly dependent on mounting method and positioning of the sensor to ensure repeatable detection of the signature. Even with proper sensor mounting and positioning, signature detection may be corrupted by background vibration and variation in operating conditions such as running speed, input voltage and motor loading. It will be appreciated that the likelihood of erroneous indication of failure in a system relying on mechanical fault detection is high. As an example, the assessment of the condition of the motor's bearings involves analyzing the mechanical vibration of the motor and separating out the specific frequencies related solely to bearing flaws ( and/or any sum and difference frequencies and related harmonics). Unfortunately, the presence of, and possible coincidence with, other vibrations in the vibration spectrum often interfere with detection of the desired signal. Expensive and sophisticated means are necessary to gain the desired information and the success of such a system in detecting or predicting a fault is less than desirable.

Accordingly, it is desirable to eliminate the complications caused by modeling errors and both false indications and missed indication of motor faults. It is also desirable to avoid having to develop an extensive database and laboriously developed expertise in analysis of the cause of faults in electric motors. It is further desirable to eliminate the need for expensive and sophisticated means for obtaining and processing information that may indicate a fault exists.

SUMMARY OF THE INVENTION

The present invention relates to a model based fault detection system and method for monitoring and predicting maintenance requirements of electric motors and more particularly fractional horsepower electric motors. Using the system, it is possible to obtain information for early diagnosis of impending mechanical failure of the electric motor in the operational environment under unknown loading conditions. Since the method and system of the present invention is software based and utilizes data obtained from non-intrusive measurements, implementation costs are significantly less than prior art maintenance methods.

The system comprises computer means coupled to voltage, current and speed sensors by a multifunction data acquisition means. The sensors provide continuous real-time information of the input voltage and current and of the output voltage signal developed by the motor's tachometer.

The computer means uses such information in continuously running a fault detection and diagnostic algorithm in conjunction with a diagnostic observer.

The system and method utilize a multivariable experimental modeling algorithm to obtain a model of the electric motor by determining the structure, that is the order of the differential equations mathematically describing the motor, and the motor's invariants, that is, parameters such as inductance, motor resistance, moment of inertia, non-physical parameters such as A, B and C matrices of state equations describing the motor and other selected parameters. In the preferred embodiment, the model of the electric motor is developed when the motor is known to be running free of faults, usually after the motor is initially installed. Later, during operation, the model output voltage signal is calculated based on the actual input voltage and current applied to the motor and continuously compared to the measured output voltage signal of the motor. The algorithm quantifies the comparison in terms of a residual which is generated by subtracting the respective signals.

The diagnostic observer analyzes the residual and determines if the motor is fault free or operating in a manner other than fault free. Under fault free operation, the residual is ideally equal to zero although in operation a selected tolerance threshold may be selected to compensate for modeling errors and noise or other perturbations that may result in a non-zero residual.

When a motor component degrades such that the motor is operating outside its intended operating range or when a fault actually occurs, the residual will have a non-zero value that exceeds the tolerance threshold. When the computer means detects a non-zero residual, an impending fault is likely and a warning is given so that appropriate measures can be taken to minimize the effect that would otherwise be caused by a non-functional motor. Upon detection of the impending fault, the diagnostic observer evaluates the measured variables of the motor, determines the deviation from the reference value and develops a diagnosis of the likely failed or failing component.

In another embodiment of the present invention, a system for detecting and diagnosing mechanical faults of fractional horsepower electric motors is disclosed. Rather than developing an extensive database to correlate faults with the measured signals, the present embodiment incorporates a mathematical model of a fault free motor and measures operating parameters of the motor under test that are insensitive to environmental, operational and mounting distortion.

This embodiment is particularly useful in the manufacture of fractional horsepower electric motors and especially in the performance of quality control testing. After manufacture of a plurality of motors, a multivariable system identification algorithm is used to develop a base model using the entire available population of motors. It should be understood that the population may contain a number of faulty motors so it may be necessary to refine the model by selecting a tolerance threshold and re-testing each motor against model. Those motors that fall outside of the threshold are removed from the population and the remaining motors are used to develop a revised base model. The revised base model is stored in a computer means for quality control testing of all subsequently manufactured motors.

If during quality control testing, the parameters, such as the inductance, motor resistance, friction coefficient or the moment of inertia, of a motor fall outside the threshold tolerance established in the base motor model, the motor under test is classified as having a fault. By comparing the parameters of the motor under test with the base motor model with different tolerance limits, it is possible to further classify the motor fault and display diagnostic information.

DETAILED DESCRIPTION OF THE INVENTION

Figure 1:
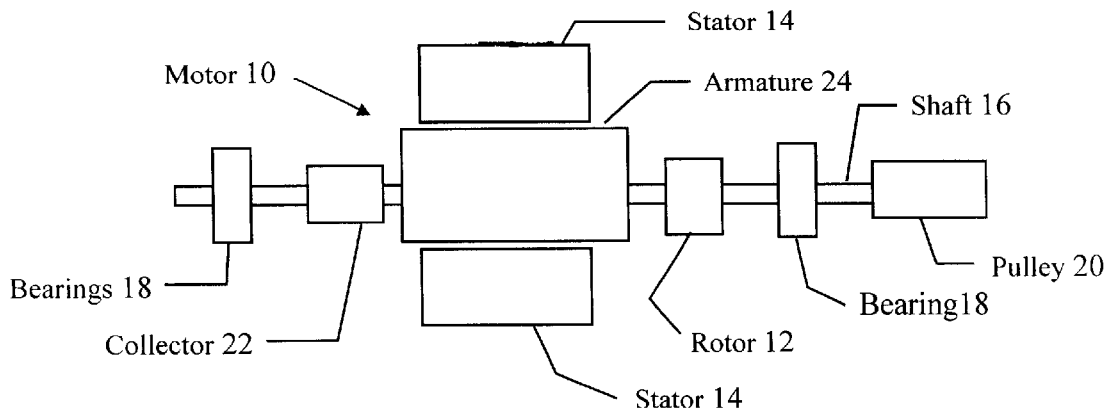
FIG. 1 is a schematic representation of an electric motor useful in practicing a preferred embodiment of the present invention.
Figure 2:
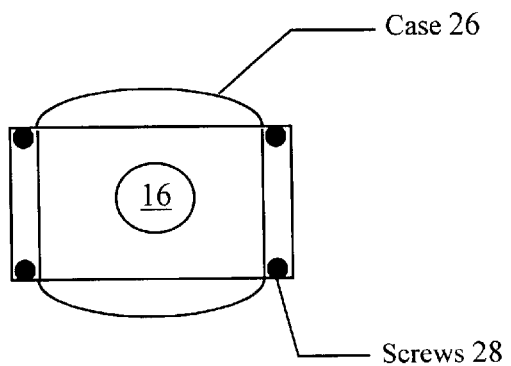
FIG. 2 is a top view of typical motor enclosure.

Referring to the drawings more particularly by reference numbers, FIG. 1 shows a system comprising an electrical motor 10 such as a fractional horsepower electric motor. For purposes of illustration, motor 10 comprises rotor windings 12, stator 14 and shaft 16 supported near either end by bearings 18. Pulley 20 couples shaft 16 to the load (not shown). Collector 22 conducts current into or out of the rotor 12 and armature 24 which, in conjunction with the stator, creates the magnetic field resulting in the motion of the motor. One skilled in the art will appreciate that motor 10 may have a rotor with neither commutator nor windings. Motor 10 is mounted in a case 26 that seals out dust, moisture and other foreign matter. FIG. 2 is a top view of a motor enclosure and more particularly a case 26 where the base of the case is fastened to the cap by means of screws and nuts 28 in a manner well known in the art.

Figure 5:
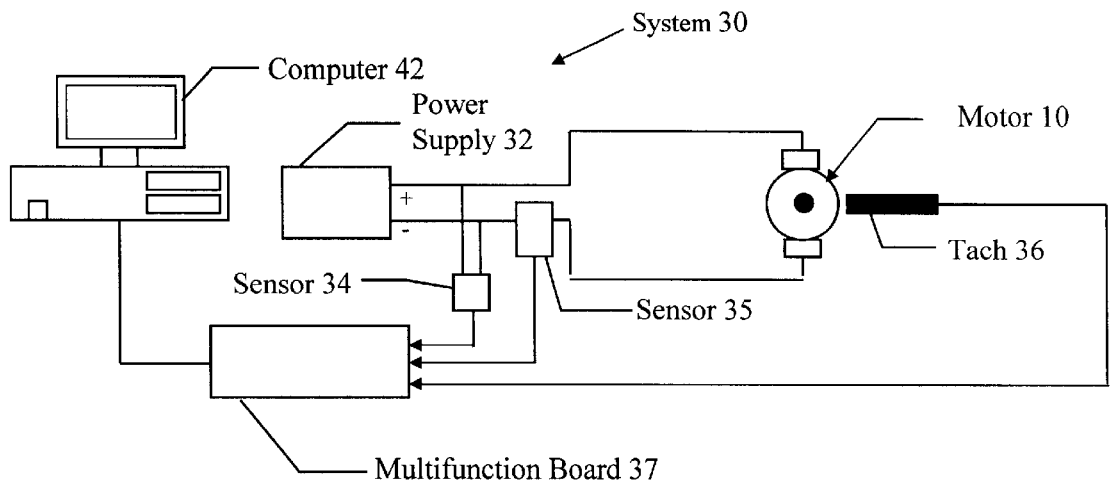
FIG. 5 is a schematic representation of system level configuration of a preferred embodiment of the present invention.

Referring now to FIG. 5, a preferred embodiment of a motor condition monitoring system 30 according to the present invention is shown. System 30 comprises motor 10, a source of power 32, which may be either line voltage or a power supply such as Hewlett Packard 6010A, a plurality of sensors 34, 35 and 38, a multifunction board 37 and computer 42. When voltage is applied, motor 12 ramps to its operating speed, usually within 25 millisecond of the application of power, with shaft 16 rotating at a speed that is dependent in part on the applied voltage and the load. The speed of motor 12 is detected by tachometer sensor 36 converted from an analog signal to a digital signal by multifunction input/output board 37 and transmitted to computer 42. Tachometer sensor 36 may be a rotational speed encoder or a built-in tachometer designed into motor 10. The multifunction board is further coupled to a voltage sensor 34, which may be a 1:100 voltage dividing probe by way of example, and a current sensor 35 preferably with a minimum response time of 23 nanoseconds (examples of acceptable current sensors include the Tektronix 6303, a 100 amp ac/dc current probe, the Tektronix 502a power module and the Tektronix 503b ac/dc current probe amplifier). Signals from sensors 34 and 35 are also conditioned by board 37 and input to computer 42. Computer 42 records sensor data in its memory (not shown).

Computer 42 implements a fault detection and diagnostic model of an ideal motor which is also stored in memory. In the preferred embodiment, the model of the motor is initially developed using a multivariable system identification algorithm, Experimental Modeling Toolbox (EMT) developed by Ahmet Duyar and now commercially available from Advanced Prognostic Systems, Inc. 4201 North Ocean Boulevard. Suite 206, Boca Raton, Fla. 33431. EMT is an experimental modeling tool that generates a mathematical equation describing the dynamic relationships between input and output measurements obtained from experiments designed to provide characteristics of the system under a selected range of possible modes of operation. Such information includes the bandwidth of the system, the optimal scan rate and duration, and an input signal rich enough to exercise the system over the complete bandwidth of the system. As is known in the field, experimental modeling is the selection of mathematical relationships that seem to fit the observed input and output data. Accordingly, during the modeling process, equations are developed that describe the behavior of the various system elements and the interconnections of these elements.

The experimental model of the system is described by a set differential equations represented in matrix form. The EMT program determines the structure of the system, that is, the order of the system, the parameters and the constant coefficients of the variables of the differential equations. In the preferred embodiment, the structure is determined by developing an information matrix utilizing the input and output data The row by row rank search of this matrix is utilized to determine the structure of the system. The theoretical concept in determining the row by row rank search is explained more fully in a published paper entitled: *State Space Representation of the Open-Loop Dynamics of the Space Shuttle Main Engine*, by Ahmet Duyar, Vasfi Eldem, Walter C. Merrill and Ten-Huei Guo, December 1991, Vol. 113, Journal of Dynamic Systems, Measurement, and Control at pages 684–690, the disclosure of which is incorporated herein by reference.

Once the structure of the system is determined, the number of parameters contained in the set of differential equations is known. The measured data is utilized with the set of differential equations containing unknown coefficients to generate several equations. The number of generated equations is more than the number of unknown coefficients. Least squares technique is utilized to determine the unknown coefficients in a manner known in the art and as described in the above-referenced paper.

The model based fault detection and diagnostic scheme of the present invention describes a fault free motor with a series of equations described in more detail below. Since faults in motor 10 change the parameters, the equations of motor 10 will differ from the expected equations generated by the model. The scheme of the present invention relies on the concept of analytical redundancy where signals generated by the model are compared to the measured signals obtained from motor 10 to determine whether the motor is properly functioning. The model replaces the need to develop a priori information about the motor. Based on the comparison, computer 42 determines if the motor is operating fault free by generating residual quantities and their analysis. The present invention develops forecasts of information vital to early diagnosis of impending failures of electric motors while in operation under unknown loads.

By way of explanation, consider a fault free system described by the following discrete state space equations:

$$x(k+1) = A\, x(k) + B\, u(k) \tag{1}$$

$$y(k) = C\, x(k) \tag{2}$$

where x, u, and y are the nx1 state vector, the px1 input vector, and the qx1 output vector, respectively and k denotes discrete time increments. The A, B, and C are the known nominal matrices (parameters) of the system with appropriate dimensions. Using a fractional horsepower electric motor, by way of example, the experimental model uses input voltage, current and speed measurements.

Figure 3:
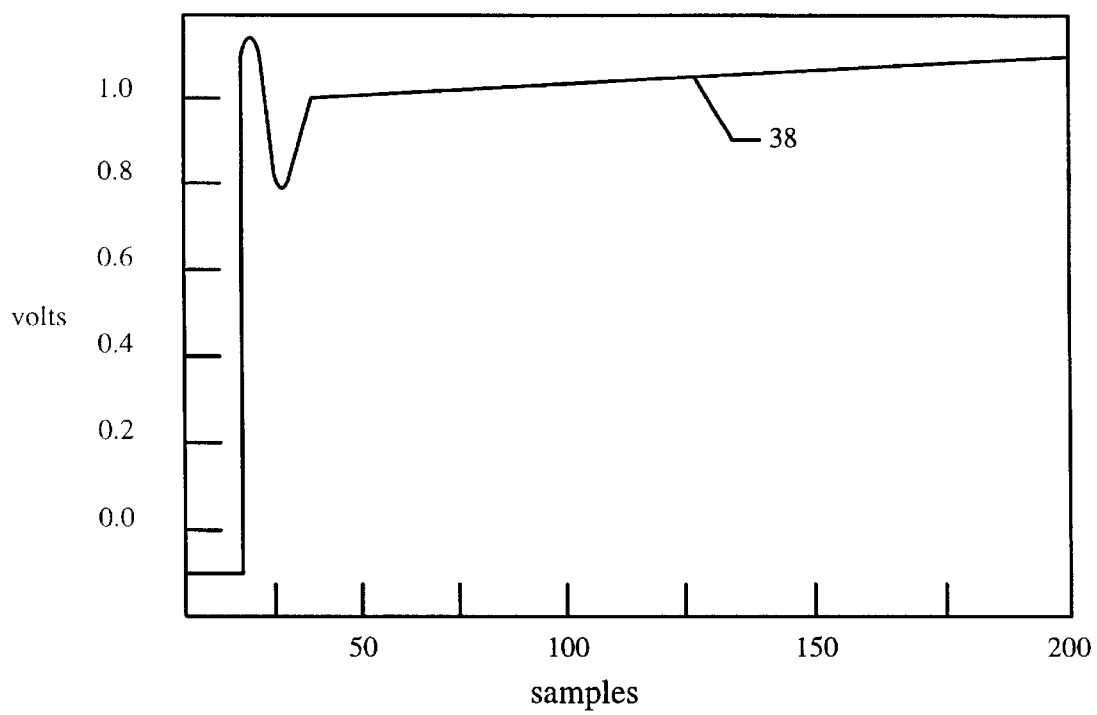
FIGS. 3 and 4 show typical input and output waveforms for practicing one embodiment of the present invention.
Figure 4:
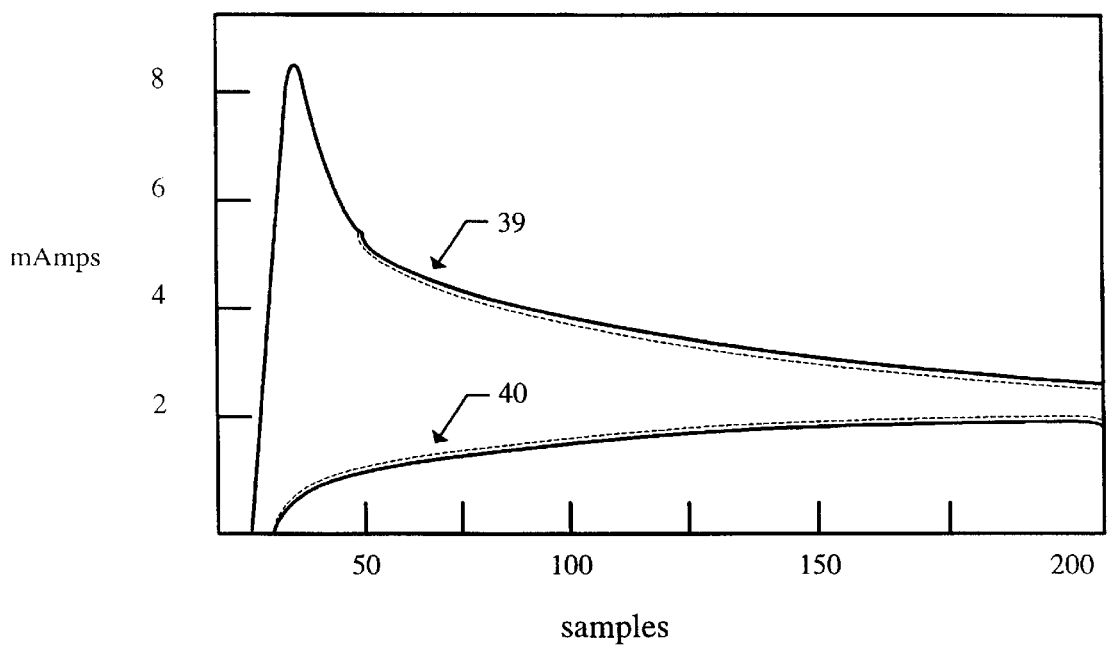

In FIG. 3, a plot of input voltage 38 used to power up motor 10 is shown. In the preferred embodiment, input voltage 38 is a step input and is represented in the experimental model as a row vector containing the measured voltage. FIG. 4 shows the experimentally determined current and speed output signals 39 and 40, respectively, with the measured current and speed output signals shown with a solid line. The resulting system description may be represented by equations (3) and (4) where the A matrix, in state-space representation, by way of example, is of the form:

| 0 | 0 | 0 | 0 | 0 | 0 | 0 | 0 | −0.0010 | 93.3676 |
|---|---|---|---|---|---|---|---|---|---|
| 0 | 0 | 0 | 0 | 0 | 0 | 0 | 0 | 0.0000 | 0.0020 |
| 1.0000 | 0 | 0 | 0 | 0 | 0 | 0 | 0 | −0.1857 | −260.2940 |
| 0 | 1.0000 | 0 | 0 | 0 | 0 | 0 | 0 | −0.0001 | −0.0920 |
| 0 | 0 | 1.0000 | 0 | 0 | 0 | 0 | 0 | 0.0258 | 487.7519 |
| 0 | 0 | 0 | 1.0000 | 0 | 0 | 0 | 0 | 0.0001 | 1.0220 |
| 0 | 0 | 0 | 0 | 1.0000 | 0 | 0 | 0 | 0.4119 | −636.3152 |
| 0 | 0 | 0 | 0 | 0 | 1.0000 | 0 | 0 | −0.0002 | −2.7525 |
| 0 | 0 | 0 | 0 | 0 | 0 | 1.0000 | 0 | 0.5182 | 315.4224 |
| 0 | 0 | 0 | 0 | 0 | 0 | 0 | 1.0000 | 0.0002 | 2.8204 | the B matrix is of the form:

−2.6188
0.0012
4.3719
0.0092
−3.5824
−0.0259
1.0257
0.0156
1.0915
0.0000 and the output C matrix, which associates the variable with the output, is of the form:

$$\begin{pmatrix} 0 & 0 & 0 & 0 & 0 & 0 & 0 & 0 & 1 & 0 \\ 0 & 0 & 0 & 0 & 0 & 0 & 0 & 0 & 0 & 1 \end{pmatrix}$$

In addition to the discrete A, B and C matrices of the system which are determined by the modeling program, a standard error of estimate (SEE) is also determined. The SEE provides an estimate of the modeling error by comparing the modeled output with measured output. For the above example, the SEE for the model is 2.8% for the current output and 0.67% for the speed output.

When a fault occurs in motor 10, the parameters and consequently the response of system 30 will be different. Denoting the faulty parameters and variables of the system with subscript f, the equations describing the faulty system become:

$$x_f(k+1) = A_f x_f(k) + B_f u_f(k) \tag{3}$$

$$y_f(k) = C_f x_f(k) \tag{4}$$

In its simplest form, a residual vector, r(k), may be defined as the differences between the output of the fault free system and the output of the faulty system as:

$$r(k) = y_f(k) - y(k) \tag{5}$$

In the absence of the noise and the modeling errors, the residual vector r(k) is equal to the zero vector under fault free conditions. A nonzero value of the residual vector indicates the existence of faults. When noise and modeling errors are present, the effect has to be separated from the effect of faults by comparing the residual magnitudes with selected threshold values. Using the observed distribution of residuals under fault free conditions, the threshold values are determined by selecting a level of confidence (within three standard deviations) so that false alarms and missed fault are minimized.

Figure 6:
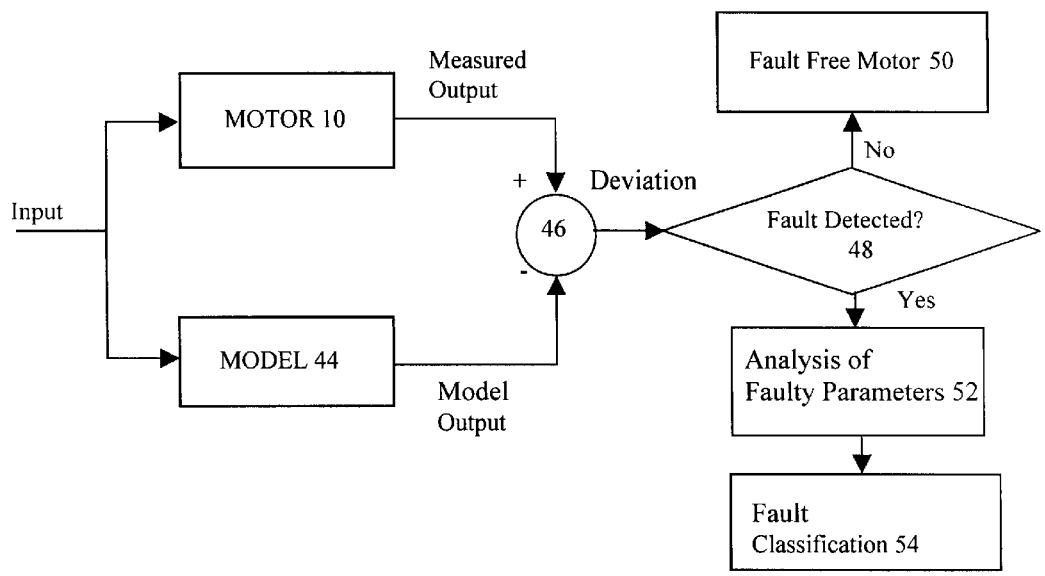
FIG. 6 shows a block diagram of a fault detection and diagnosis system according to an embodiment of the present invention.

Referring now to FIG. 6, the multivariable identification algorithm, EMT, is used to develop a base line experimental model 44 of motor 10. Model 44 comprises the parameters of the difference equations, i.e., A, B, and C and their orders, i.e., n in equations (1) and (2). As opposed to parameters of the theoretically derived model, the experimental model parameters do not provide physical meanings. In other words, the changes in these parameters may not be used to understand cause-effect relationships. Though the physical meaning of the parameters are lost, the experimental model provides a sufficiently accurate representation of motor 10, since it is not derived using any assumptions. System 30, however, eliminates the need to rely on a priori information about the structure of motor 10 other than the assumption that motor 10 is initially fault free.

The outputs of model 44 are evaluated with the EMT algorithm by computer 42 using the measurements obtained from the voltage sensor 34, the speed sensor 36 and the current sensor 26 to obtain the model output. The model output is compared to the output of the motor at indicated by summer 46 to generate residual r(k). Comparator 48 determines if the residual vector r(k) is equal to the zero vector and correspondingly that the motor is operating under fault free conditions. If comparator 48 determines that the residual vector r(k) has a nonzero value, one or more faults are indicated. However, since noise and modeling errors are typically present, the residual vector r(k) value is first compared to selected threshold values to eliminate false readings. If the residual value is less than the threshold it is more likely that the nonzero value is due to such noise or modeling error and motor 10 is deemed to be fault free. System 30 then reports the fault free nature of the system, as indicated at box 50. However, if the residual value exceeds is the threshold a fault is indicated and system 30 begins the analysis 52 of the fault. Based on the analysis 52, the fault is classified and reported at 54 to the user or retained on computer 42 for future reference.

By using a model based diagnostic routine, the current response of the motor under fault free conditions can be modeled and subsequently compared to the current response of the same motor during operation. In the present invention, computer 42 includes means for iteratively performing an fault detection motor condition monitor (MCM) algorithm for predicting, detecting and classifying mechanical faults of electric motors. The system and method of the present invention may be used in both production and operational environments.

Fault classification is accomplished by determining changes occurring in the parameters of motor 10 and associating the changes with motor faults by using physical parameters of a theoretically obtained model. Consider the simplified theoretical equations (6) and (7) describing a universal motor capable of operating on either direct- or alternating current subject to a DC voltage input:

$$L \, di/dt + Ri = V + k_1 \omega i \tag{6}$$

$$J \, d\omega/dt + f\omega = k_2 i^2 + M \tag{7}$$

where L, R, J and f are the inductance, the resistance, the moment of inertia and the friction coefficients of the motor, respectively, while $k_1$ and $k_2$ are the motor constants. In equations (6) and (7), the output variables, the current and the speed, are denoted by i and ω, respectively, while the input variable, the voltage, is denoted by V. The load is denoted by M.

In the MCM algorithm, the load M is not generally available or easily measured. Therefore, it is necessary to operate on equations (6) and (7) to eliminate the load term for use by the diagnostic observer. In one embodiment, the diagnostic observer simply bases the model on equation 6 which is independent of load. Although partial information is provided to the diagnostic observer in such embodiment, motor friction and constant $k_2$ are not available and there may be a higher percentage of unknown fault reports. Accordingly, if such information is necessary, the diagnostic observer may take the derivative of equation (7) which will eliminate the load term assuming a constant load. As will be apparent to one skilled in the art, other possible mathematical means are available for eliminating the load term such as expressing equations (6) and (7) in matrix form and multiplying both sides with appropriate matrix operators.

Referring again to FIGS. 1 and 2, common mechanical faults may arise from an unbalanced rotor 12, unevenly torqued screws 28, or defective bearings 18, collector 22, or pulley 20. These mechanical faults cause vibration and noise once motor 10 is installed and operating with load M. Recognizing that mechanical vibration implies a physical displacement, the vibration caused by bearing flaws will induce periodic displacement in shaft 16. In an electric motor, the drive shaft is turned by an armature assembly. Mechanical faults will cause misalignment of the rotor, which in turn causes the air gap to be non-symmetric and changes the inductance, the resistance and the motor constant parameters all of which are included in equation (6). The current passing through the motor is, in part, a function of the magnetic field in the air gap between the armature and the stator (or field coils). The periodic displacement induced in the drive shaft effect the symmetry of the air gap and the magnetic field in the air gap. The magnetic field in the air gap, in turn, affects the current through the motor. Since the perturbing influence on the magnetic field in the air gap is periodic and of known frequency, so is the effect on the current.

Accordingly, a change in the nominal value of the inductance parameter, L, is associated with an imbalanced rotor fault. An observed change in the resistance parameter, R, is considered as an indication of a collector fault. A bearing fault is determined when the change in inductance coefficient exhibits an oscillatory behavior and/or when both inductance and the friction coefficients change in tandem.

Fault free and faulty parameters and the standard deviations of fault free parameters are shown in Tables 1 and 2. In Table 1, for a given voltage V and load M, the current and speed output values predicted by the model 44 are shown together with selected tolerance parameter (three standard deviations) and an example of current and speed measurements. As will be noted, the current measurement exceeds the predicted value by more than three standard deviations. Accordingly, a fault is indicated.

TABLE 1

| Outputs | Std Error Of Estimate For Base Motor | Three Std Deviation | Example: Reading Indicative of Faulty Motor |
|---|---|---|---|
| i | 0.0072 | 0.0008 | 0.0098 |
| ω | 0.0197 | 0.0025 | 0.0245 |

The parameters of faulty motor 10 are examined in Table 2. As will be noted, the inductance, L, of faulty motor 10 exceeds the corresponding inductance parameter predicted by model 44 by more than one standard deviation while all other parameters are less than the predicted value plus one standard deviation. As noted above, this type of fault is indicative of an imbalanced rotor fault which is reported by the fault classification element 54 of system 30.

TABLE 2

| | Base Motor Parameters | Standard Deviations Of Base Motor Parameters | Example: Faulty Motor Parameters |
|---|---|---|---|
| L (Inductance) di/dt | 0.0434 | 0.0005 | 0.0445 |
| R (Resistance) i | 1.6269 | 0.1087 | 1.7236 |
| f (friction coefficient) ω | 1.1517 | 0.0270 | 1.1632 |
| $k_\tau$ (motor constant)i | 377.4760 | 3.3765 | 374.7121 |

Figure 7A:
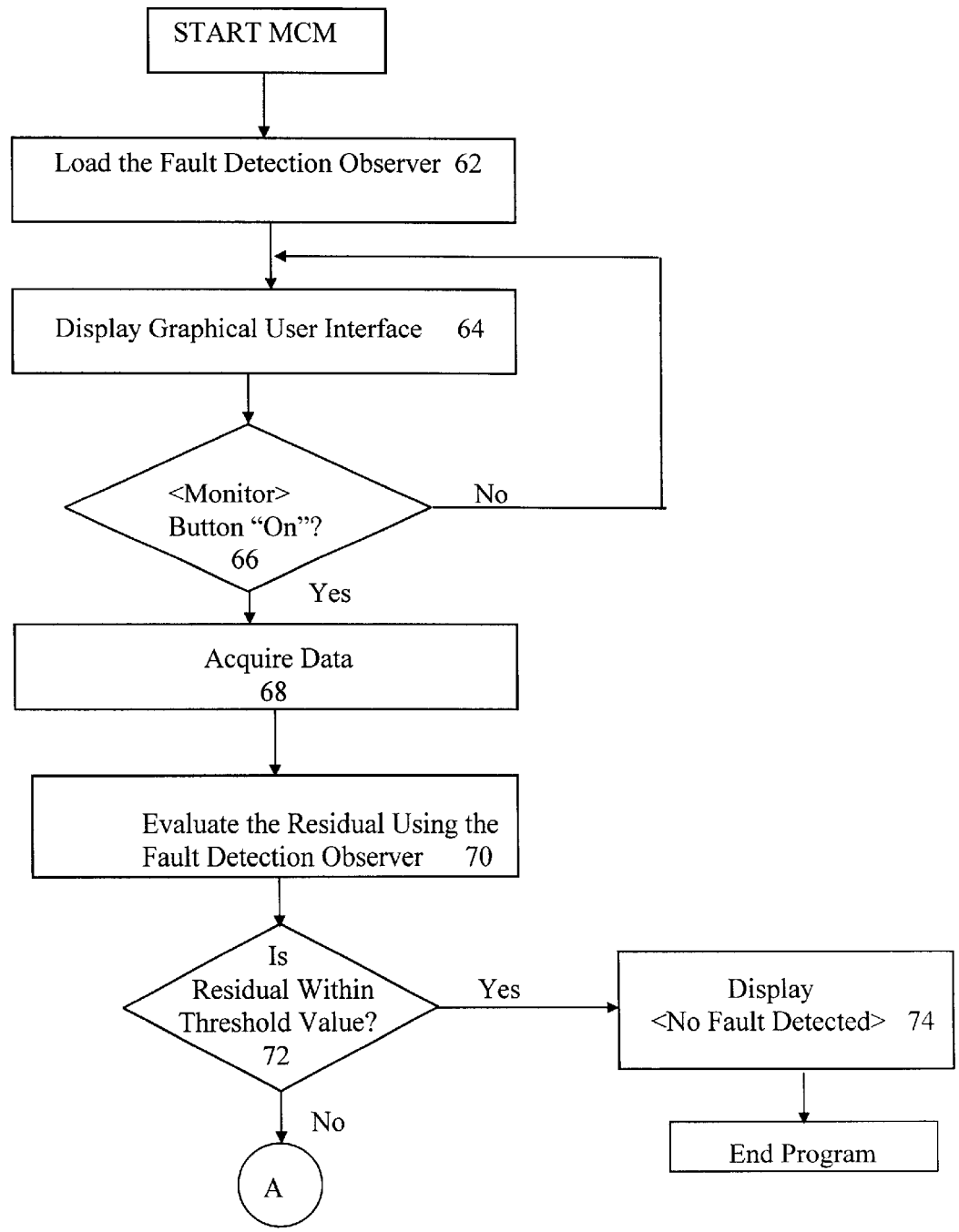
FIGS. 7A–7B and 8A–8F show flow diagrams of the operation of the fault detection and diagnosis system of the present invention according to embodiments of the present invention.
Figure 7B:
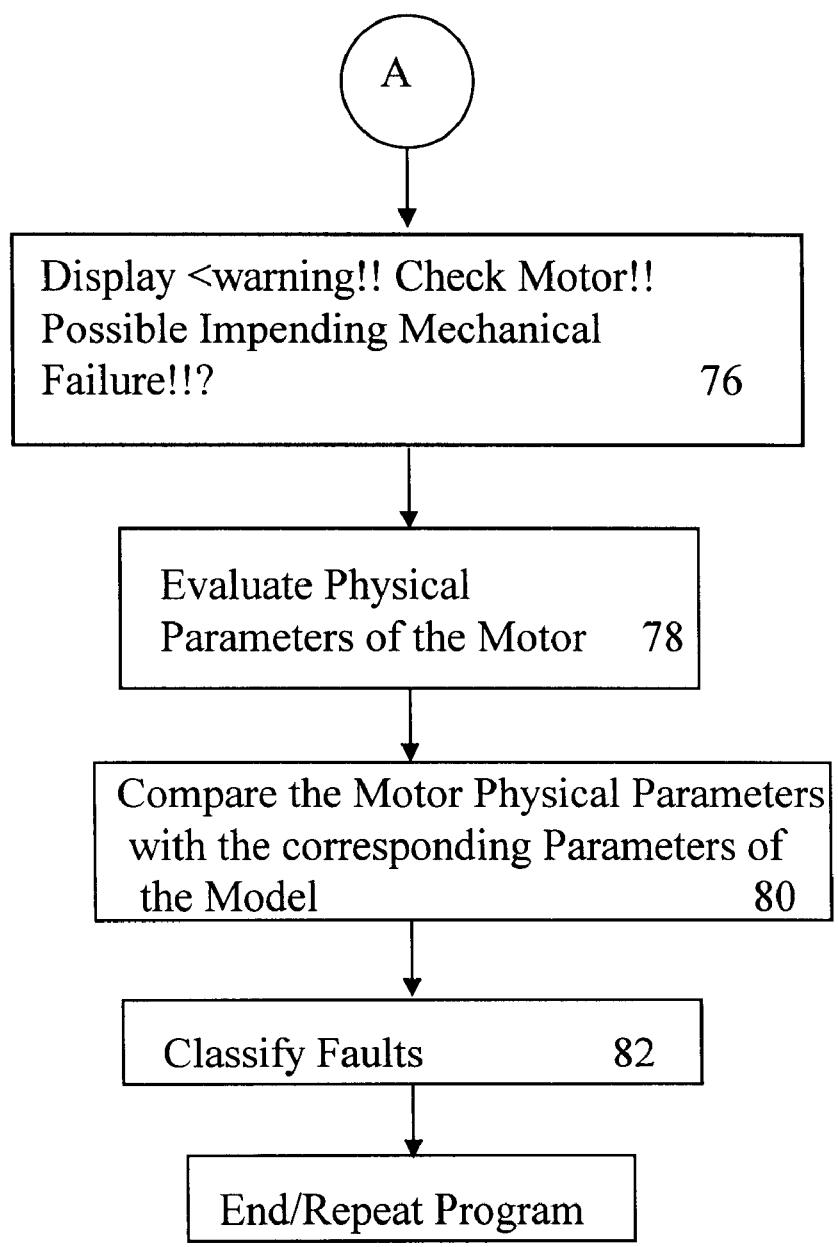

The flow diagram of FIGS. 7A–7B summarizes the steps for implementing system 30 once model 44 has been developed. Specifically, at selected intervals computer 42 loads model 44 into memory, step 62, and displays on the display portion of computer 42 information for the user, step 64. Upon receiving instruction to initiate the monitoring of motor 10, at pre-specified intervals or continuously, system 30 begins to acquire data, steps 66 and 68, from sensors 34–38. Data acquisition continues at a rate that may be determined by the user. Computer 42 calculates residual values r(k) which is then compared to the expected residual developed by model 44, step 72. If the residual is within the threshold limits, the motor is operating fault free and this information is displayed on the display of computer 42 to the user at step 74. If, however, a fault is indicated, this information is displayed on the display, step 76.

Once a fault is detected, system 30 is able to evaluate the fault and provide diagnostic information to the user. Using the predictive nature of the present invention, it is possible to avoid costly unplanned catastrophic failure. As shown in FIG. 7B, the diagnostic observer portion of model 44 evaluates the physical parameters, that is current, i, and speed, ω, of motor 10 at step 78 and compares these parameters with the corresponding parameters of model 44 (see also Table 2). Based on the comparison, system 30 is able to classify and display the mechanical basis for the fault or degradation in motor performance as shown at step 82. Model 44 replaces the need to develop a priori information about the motor.

The MCM algorithm performed by computer 42 is referred to in FIGS. 7A and 7B. The basic concept in monitoring the condition of the motor is to either intermittently or continuously observe the parametric variations with reference to the same parameters evaluated when the motor is known to operate satisfactorily, as an example, when it is first put into operation when it is known that the motor is running free of faults. During subsequent operation of the motor, the deviation of the outputs, from the reference outputs. This deviation is then compared with predetermined threshold values. If the deviation exceeds the threshold value, a fault is detected. The fault is classified by evaluating the parameters of the diagnostic model and comparing the parameters with their initial value again using appropriate threshold values for these parameters.

In the manufacture of electric motors, it is possible to develop a model that encompasses a range of production process variation rather than using the parameters obtained from a single motor as described above in describing the MCM system and method. This concept is utilized to develop methods for the detection and diagnosis of mechanical faults of electric motors as part of the testing procedure during the manufacturing process and particularly, for quality assurance process step employed by most manufacturers just prior to shipping a motor. For quality assurance applications a method and an algorithm, called Motor Quality Monitor (MQM), utilizing this method of the present invention is discussed below.

Basic functions of the MQM algorithm are to test the electric motor, display the test results, control the experimental testing (that is, developing a base model as will be described below in more detail) and store the measured and digitized data in memory for archival purposes. Since there is no reliable technique or measurement to identify fault free motors, first a method to obtain the model of typical fault free motors (the "base model") is developed.

A more detailed explanation of the MQM method is depicted in FIGS. 8A–8F. The MQM method encompasses two basic functions: (1) development of a base motor model and (2) ongoing quality assurance testing of fractional horsepower electric motors. A user may select either function from a menu presented on the display device of computer 42. In the preferred embodiment, "user defined" parameters are entered, threshold limits and the number of motors to be tested, for example, before the user chooses one of the following three options: "Base Motor Model Development", "Select a Base Motor Model" or "Quality Assurance Test".

If a base motor is not available, step 90, the "Base Motor Model Development" option, step 92, will need to be initially selected where the user is asked to supply the information, presented in Table 3, if different from the default setting, step 94.

TABLE 3

| USER SUPPLIED INFO | DESCRIPTION OF INFO | DEFAULT SETTING AND/OR OPTIONS |
|---|---|---|
| Enter Scan Rate | Sampling frequency of data acquisition | 500 Hz to 24 kHz Initially set to 24 KHz |
| Enter Scan Time | Duration of data acquisition | 0.4 sec to 1.0 sec |
| Enter Date File (loc/name) | Location and name of files where test data is stored | c:\File ID |
| Enter Tolerance Multiplier | Adjustment factor: multiplies standard deviations to obtain threshold variable | typical = 3x |
| Enter Base Motor Name | identifies type of motor to be modeled | Universal Motor |

The selection of "Base Motor Model Development" option is obligatory when MQM is first installed. The user has the option of developing base motors for different types of electric motors or even for the same type of electric motors but with different tolerance multipliers. The model of the motor, its parameters and their standard deviations are obtained and stored in the designated data file.

The base motor model is developed from a group of motors known to include mostly fault free motors, step 96. In one preferred embodiment of the present invention, data obtained from a group of electric motors are utilized to develop the base motor model. As will be appreciated by one skilled in the art, such a group of motors may contain fault free motors as well as some faulty motors due to the inherent inefficiencies of the manufacturing and testing process.

Using the EMT software program, an experimental model of the selected motor type is developed that represents the characteristics of the selected motor type, steps 98–100. At step 102, the model is evaluated for obvious modeling and threshold errors, steps 102–104.

Using the base motor model developed from the group, each of the motors in the group is then tested against the experimental base motor model using tolerance values obtained from the projected standard deviation of the SEE, step 106. If the outputs of one of the motors in the group deviates from the outputs of the experimental model by more than the respective tolerance values, that motor is removed from the group and the data files are groomed to remove the faulty data, steps 108–112. Further refinement of the base motor model is then undertaken using the test data for the subset of motors remaining in the group. After eliminating all motors having outputs outside of tolerance values set by the experimental model, it is possible to further yet refine the experimental model by evaluating modeling errors, the mean and standard deviations of the group, step 114 until the group contains only those motors whose outputs are within the tolerance factors selected for the experimental model. After repeating this iterative process, the experimental model will represent the characteristics of fault free motors manufactured to the same specifications. The experimental model is stored as the base motor model in a database retained in the memory of computer 42 for future reference, step 116.

If the base motor model already exists, the above process may be shortened by merely reloading the base motor model into active memory of computer 42 and the user may select the "Select a Base Motor Model" option and then begin performing the "Quality Assurance Test". Various options may be presented to the user. By way of example, the base motor model may correspond to a universal, shaded pole induction motor, synchronous motor or any other fractional horsepower electric motor. Referring again to FIG. 8A, the appropriate base motor model for the motors under test is loaded into computer memory if the "Select a Base Motor Model" option is selected or if the "Quality Assurance Test" option is selected, the testing begins for the default motor type, step 120. At this time the user may enter adjustments to the tolerance multipliers for fault detection and fault classification, steps 122 and 124. The MQM algorithm then calculates the appropriate fault detection and fault classification thresholds, step 126–128.

Figure 8A:
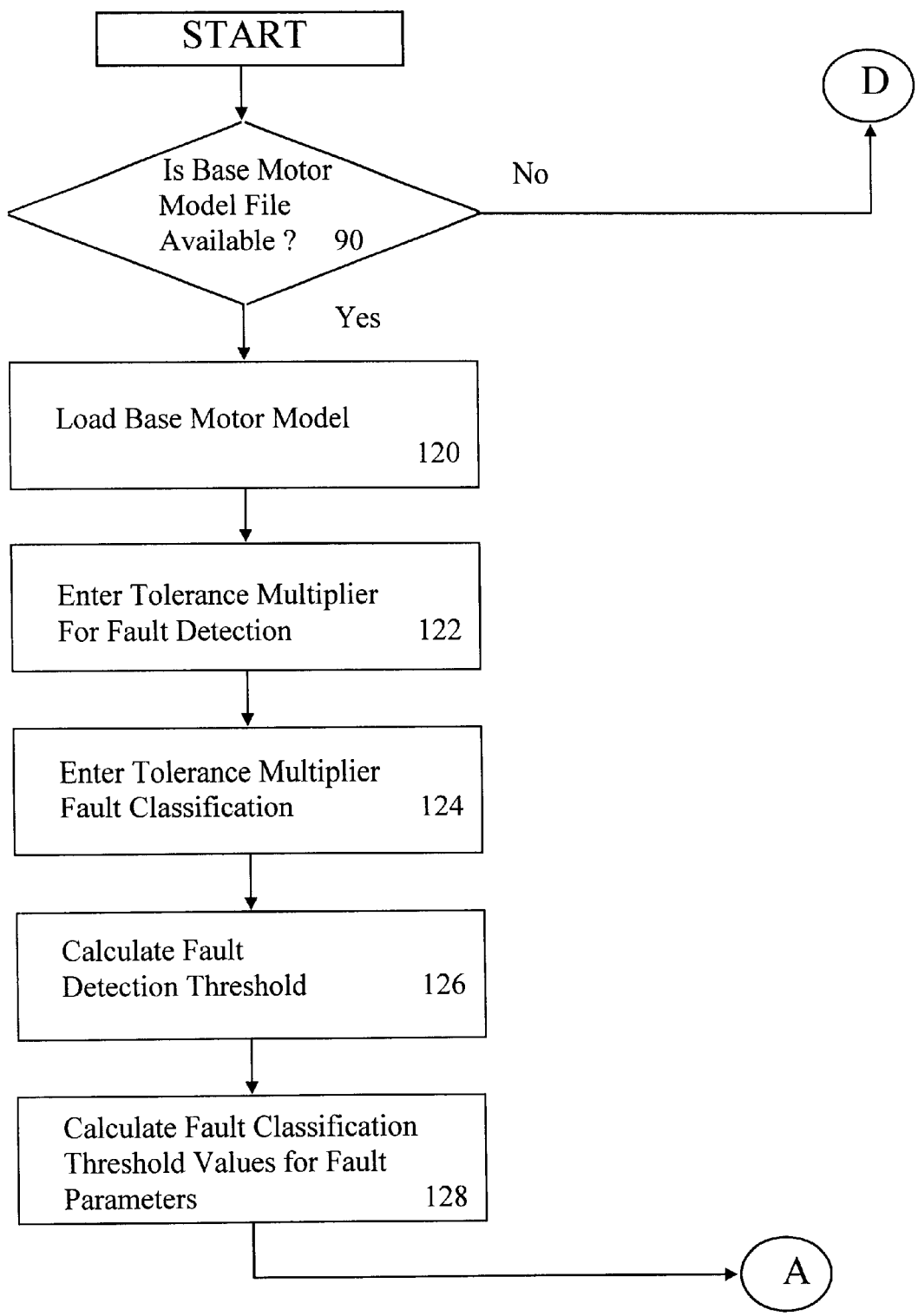
Figure 8B:
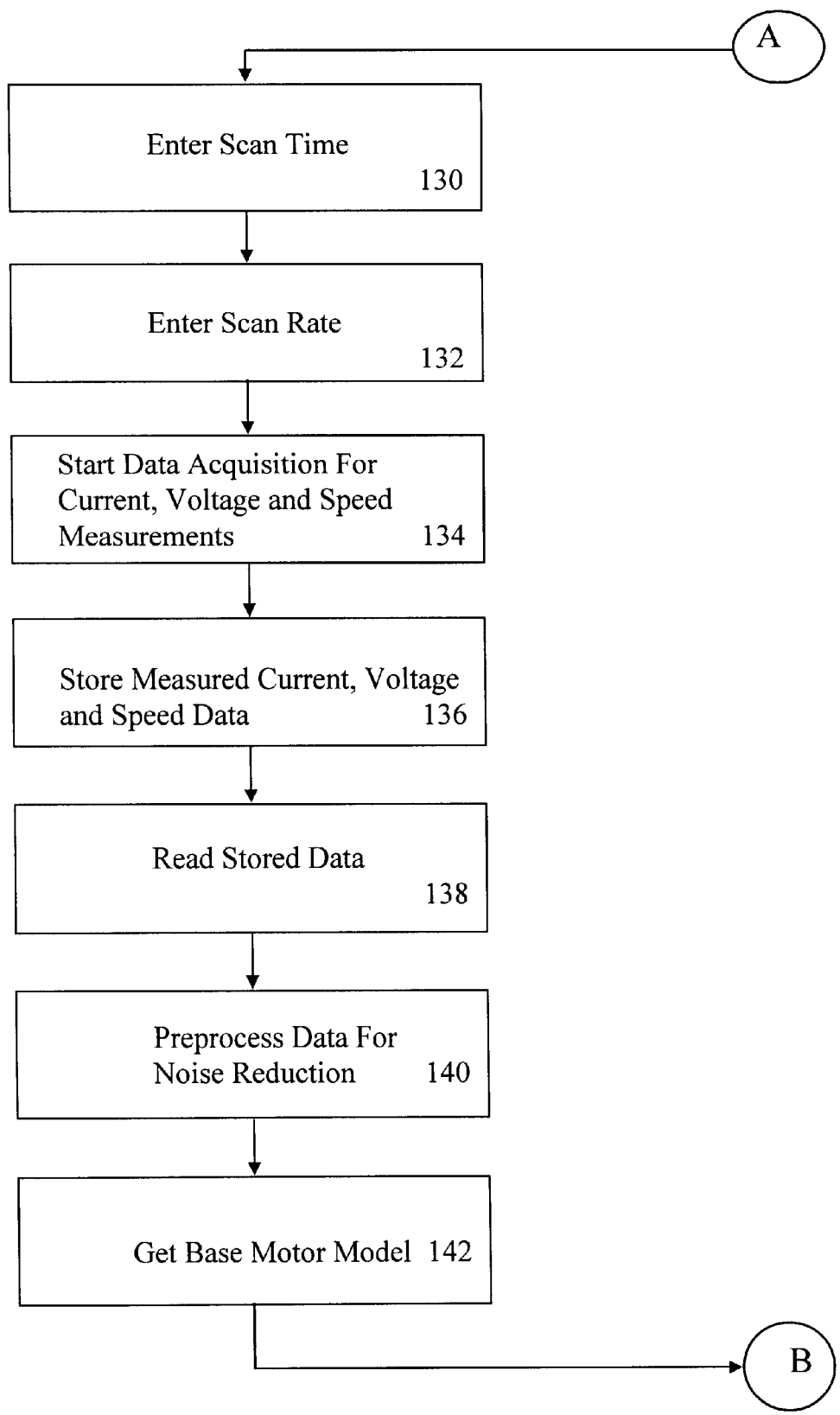
Figure 8C:
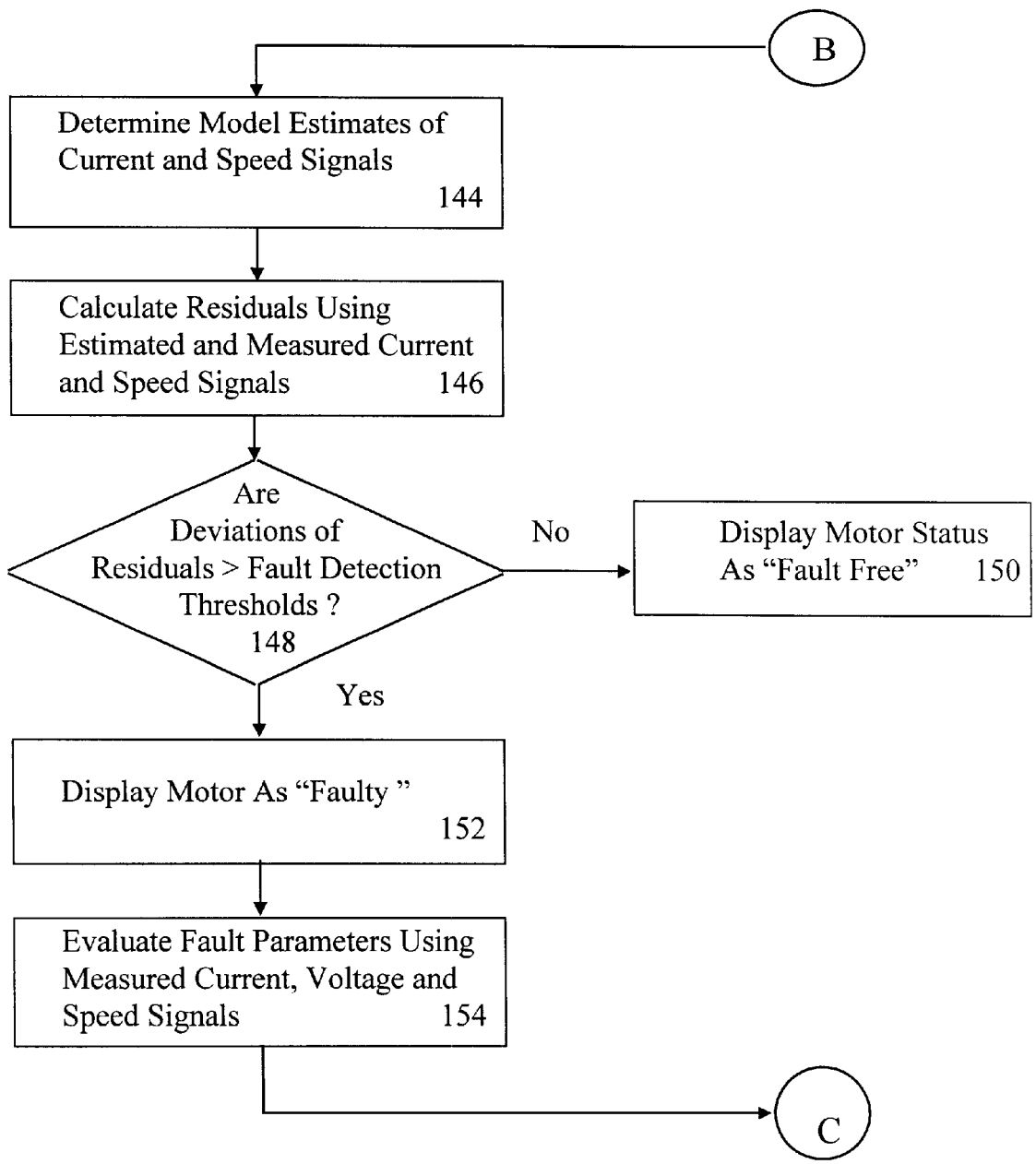
Figure 8D:
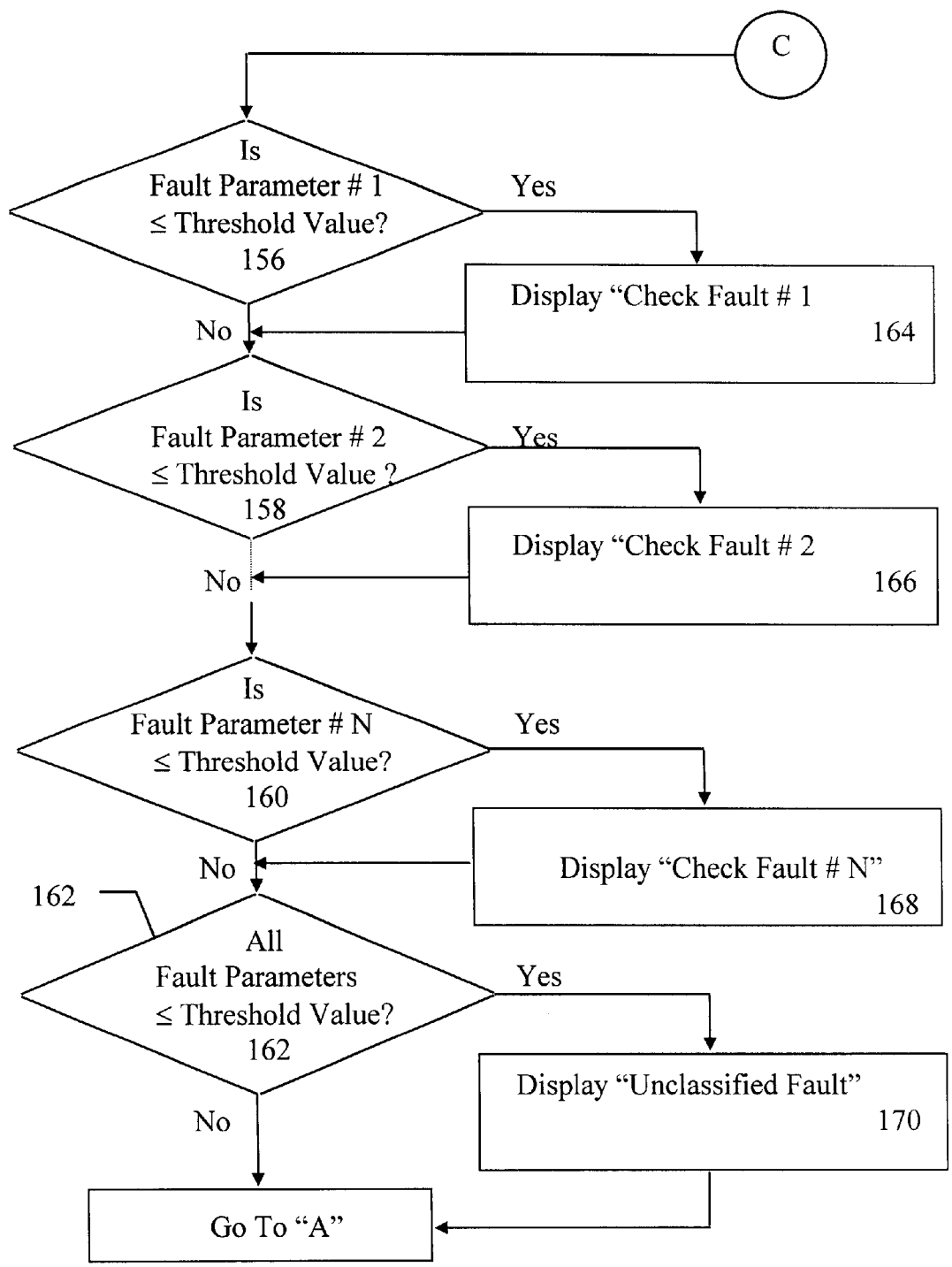
Figure 8E:
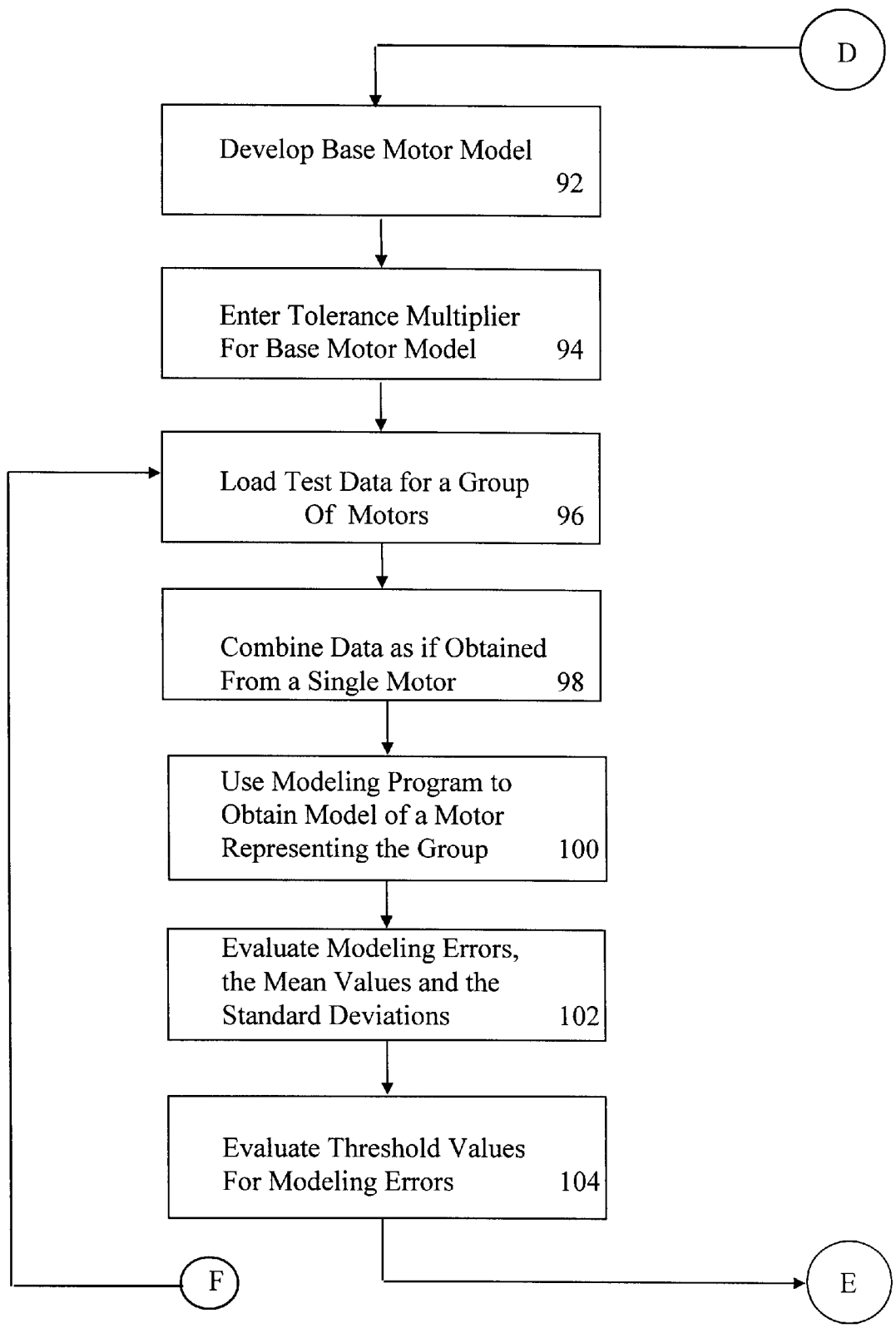
Figure 8F:
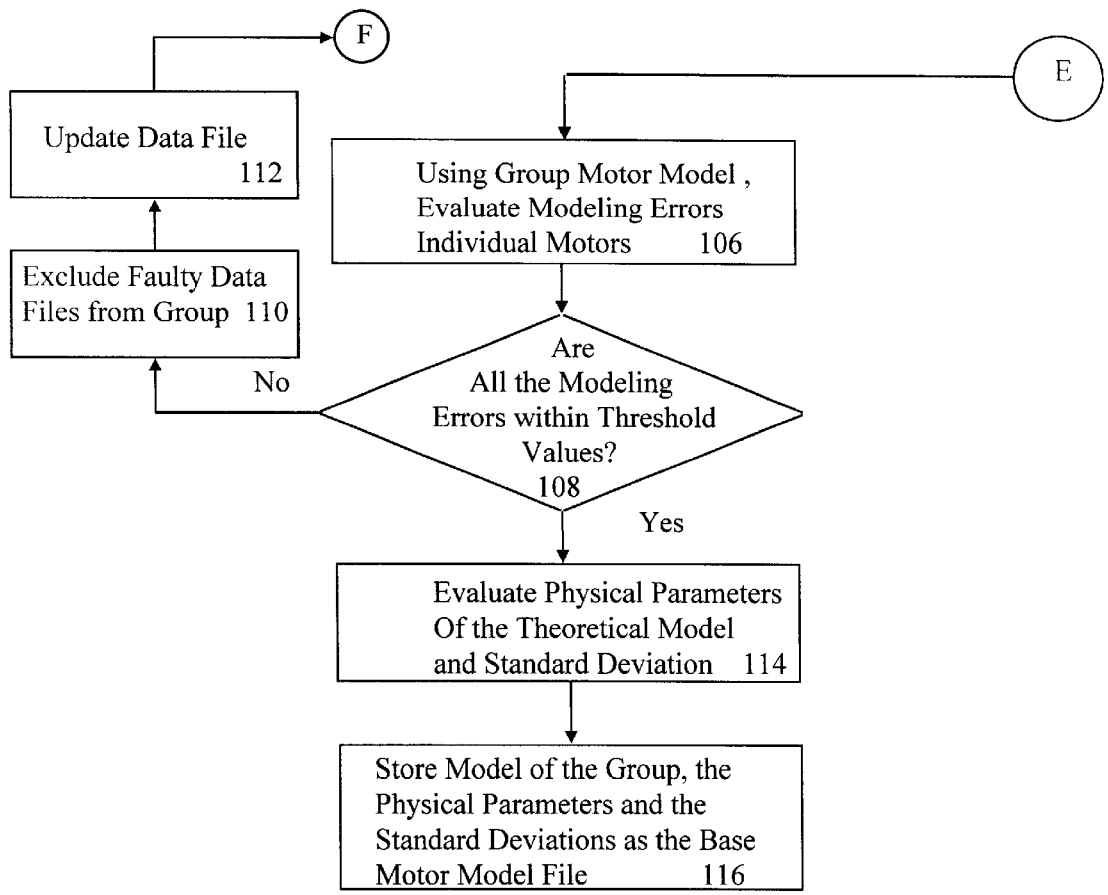

FIG. 8B shows the measurement portion of the MQM algorithm, where the measured values of the motor outputs are compared with the outputs obtained from the base motor model using selected threshold values during the testing of electric motors during the manufacturing process for quality assurance purposes. The threshold values are determined by multiplying the tolerance values used in developing the experimental base motor by the tolerance multiplier. The MQM algorithm allows the multipliers to be determined by the quality assurance engineer who will take into account the acceptable variations of the outputs of the motors due to normal manufacturing variations. If the deviations exceed the pre-selected threshold values, the motor being tested is defined as having a fault.

Specifically, once the base motor model is selected, the user inputs the necessary parameters for performing the "Quality Assurance Test" at steps 130–134 as summarized in Table 4.

TABLE 4

| USER SUPPLIED INFO | DESCRIPTION OF INFO | DEFAULT SETTING AND/OR OPTIONS |
|---|---|---|
| Enter Scan Rate | Sampling frequency of data acquisition | 500 Hz |
| Enter Scan Time | Duration of data acquisition | 0.5 sec |
| Enter Tolerance Multiplier for Fault Detection | Adjustment factor: multiplies standard deviations to obtain threshold variable for fault limit | 3x |
| Enter Tolerance Multiplier for Fault Classification | Adjustment factor: multiplies standard deviations to obtain threshold variable for fault classification | 1x |

When running the "Quality Assurance Test" the algorithm calculates the fault detection and classification limits according to the selected motor type and the appropriate tolerance multipliers. The algorithm initiates the data acquisition to acquire real-time voltage, speed and current signals from the motor under test, step 134. These signals are digitized using previously entered scan rate and scan time values, steps 130–132. The digitized signals are stored in memory, step 136, and preprocessed to eliminate noise using a butterworth software filter or any one of commercially available filter products, step 140.

The real-time voltage, speed and current signals are used by the base model motor to determine a modeled state representation of the motor under current conditions step 142 and 144. As indicated at step 146, the residual of the base model motor estimate and the actual residual of the motor under test are calculated and compared at step 148. The deviation of the calculated residuals are then compared with the fault detection threshold values. If the deviation of the outputs of the motor being tested are within the tolerance limits, the motor is identified as a fault free motor and a message is displayed or otherwise recorded, step 150.

When the motor is detected as faulty, a message is displayed, step 152 and, as indicated at step 154, classification of the fault is accomplished using the diagnostic model in a similar manner as described above. In summary, theoretically derived equations (6) and (7) describing electric motors are utilized as the diagnostic model. The physical parameters of the diagnostic model are determined experimentally from the data obtained from the group of the motors mentioned above. The physical parameters of the diagnostic model and the related standard deviations are stored in the memory of computer 42.

With the motor fault detected, the physical parameters of the faulty motor are evaluated by the MQM algorithm and compared at with the corresponding parameters of the base motor model, steps 156–162. The result of this comparison is used to classify the motor fault and display diagnostic information.

If the deviations of residuals are above the threshold values, the motor status is classified "FAULT FOUND" or a similar such phrase on the informative part of the display portion of computer 42. Once identified, the physical parameters of the faulty motor are evaluated. These parameters are compared with the physical parameters of the base motor model using the fault classification threshold values (see Table 4). For a universal electric motor, the physical parameters are the inductance, resistance and friction coefficients and motor constants as set forth in equations (5) and (6). Each of the parameters from the faulty motor are compared with the above mentioned fault classification threshold values. And a representative sample of one possible decision tree for classifying faults is shown at steps 164–170.

For example, if the inductance parameter of the faulty motor exceeds the fault classification threshold value for inductance, the decision is displayed as "CHECK BALANCE".

If the resistance parameter of the faulty motor exceeds the fault classification threshold value for resistance, the decision is displayed as "CHECK COLLECTOR".

If both the friction and the inductance parameter of the faulty motor exceed the fault classification threshold values, the decision is displayed as "CHECK BEARING".

If more than one threshold value is exceeded at the same time, all resulting decisions are displayed.

If the magnitude of all parameters are less than the corresponding threshold value, the decision is displayed as "UNCLASSIFIED" on the informative part of the display. This may occur due to the cumulative effect of changes in each parameter on the outputs of the motor. In such a situation the model may have multiple, but small, faults which may cumulate to cause the model outputs to exceed the threshold values. However, since the threshold value is user selected, it is possible to tighten tolerance values for each parameter so that it is possible to detect such marginal faults.

The MQM method is particularly well suited for use in electric motor repair shops to diagnose faults and preventative maintenance purposes. In such an application base motor models for several electric motors, varying by size and by manufacturer, are stored in computer 42. Upon receipt of a defective motor, the repairman selects the base motor model of the motor being tested and performs fault detection and diagnostic.

The method and apparatus can also be used for condition monitoring and predictive maintenance applications. In this embodiment, the third embodiment, the MQM algorithm replaces the MCM algorithm for either intermittent or continuous condition monitoring applications.

In an additional embodiment of the invention, the MQM and MCM algorithms are used directly with an existing quality assurance or a condition monitoring system, respectively, where data acquisition capabilities for measuring voltage, speed and current already exist.

In conclusion, the MCM algorithm and the MQM algorithm are very similar but each differs from the other in two aspects. First in the MCM algorithm, the system does not develop a base motor model. This is due to the nature of condition monitoring where the system is concerned only with monitoring a single motor. For this reason the MCM method advantageously utilizes the customized model of the motor being monitored. The customized model is developed when it is known that the motor is running under fault free conditions. In contrast, the MQM develops a base model that encompasses the variations normally associated with a large population. Accordingly, it is possible for a marginally operating motor to pass the test thresholds set in the MQM model but it is unlikely that continued degradation will go undetected by the MCM since the MCM model is specific to the individual motor.

The second difference that arises between the two algorithms is that the MCM is necessarily constrained by operational requirements. For example, the input signal applied to the motor is dependent on the requirement imposed by the application. One may appreciate that the input applied to model 44 may not be as "rich" of an input signal as could be applied during MQM testing. Further, under MCM testing, the actual load applied to the motor is unknown and may vary during the period in which measurements are obtained from sensor 34–38. Under these circumstances, only that portion of the model unaffected by the load is modeled. As an example, only equation (6) will be used to model the current signal using measured voltage and speed input signals to obtain results using the diagnostic observer. In alternative embodiments, techniques, such as taking the derivative of equation (7) in the case of a constant load, may be employed to eliminate the unknown load term. In such embodiments, equation (6) and the derivative of equation (7) may be combined to enhance the results obtained by the diagnostic observer.

While certain exemplary preferred embodiments have been described and shown in the accompanying drawings, it is to be understood that such embodiments are merely illustrative of and not restrictive on the broad invention. Further, it is to be understood that this invention shall not be limited to the specific construction and arrangements shown and described since various modifications or changes may occur to those of ordinary skill in the art without departing from the spirit and scope of the invention as claimed.

We claim:

1. A method for screening manufacturing quality of a plurality of motors of a common motor type and for detecting mechanical faults in at least one motor of said plurality of motors, said method comprising the steps of:

selecting a plurality of motors comprising motors operating fault free and motors operating with one or more unknown faults;

measuring a plurality of operating signals for each motor in said plurality of motors;

using said plurality of operating signals, solving a first set of discrete state space equations for said plurality of motors, where said first set of discrete state space equations are in the form of:

$x(k+1) = Ax(k) + Bu(k)$ $y(k) = Cx(k)$ where x, u, and y are a state vector, an input vector, and an output vector, respectively, k denotes discrete time increments and A, B, and C are known nominal matrices of said plurality of motors;

for each motor in said plurality of motors, solving a second set of discrete state space equations in the form of:

$$x(k+1)=Ax(k)+Bu(k)$$

$$y(k)=Cx(k);$$

comparing the solution of said second set of discrete state space equations for each motor in said plurality of motors with the solution of said first set of discrete state space equations for said plurality of motors to identify a faulty motor;

removing said faulty motor from said plurality of motors to form a second plurality of motors; and re-calculating said first set of discrete state space equations for said second plurality of motors.

2. The method of claim 1 wherein said measuring step further comprises the steps of:

measuring voltage, current and speed of each of said plurality of motors with a plurality of sensors;

multiplying the measured voltage (V), current (i) and speed ($\omega$) of each of said plurality of motors with selected invariants in accordance with the following equations:

$$L\, di/dt + Ri = V + k_1 \omega i$$

$$J\, d\omega/dt + f\omega = k_2 i^2 + M$$

to obtain motor invariants for the inductance (L), the resistance (R), the moment of inertia (J) and the friction coefficient (f) of each of said plurality of motors, and combining said selected invariants with measured voltage, current (i) and speed of each of said plurality of motors ($\omega$) where $k_1$ and $k_2$ are motor constants and M represents the load on each motor of said plurality of motors.

3. The method of claim 2 further comprising the steps of:

combining the voltage measured for each of said plurality of motors to form a composite voltage value representative of said plurality of motors;

combining the current measured for each motor of said plurality of motors to form a composite current value representative of said plurality of motors;

combining the speed measured for each motor of said plurality of motors to form a composite speed value representative of said plurality of motors;

using said composite voltage value, said composite current value and said composite speed value, evaluating the following equations:

$$L\, di/dt + Ri = V + k_1 \omega i$$

$$J\, d\omega/dt + f\omega = k_2 i^2 + M$$

to obtain motor invariants for the inductance (L), the resistance (R), the moment of inertia (J) and the friction coefficient (f) for each motor of said plurality of motors, and combining said motor invariants with measured operating signals, said measured operating signals comprising a measurement of the current (i) for each motor of said plurality of motors, the voltage (V) applied to each motor of said plurality of motors, and the speed of each motor of said plurality of motors ($\omega$) during a selected interval of time, where $k_1$ and $k_2$ are motor constants and M represents the load on each motor of said plurality of motors; and comparing the results of said equations using the voltage, current and speed of each of said plurality of motors to the results of said equations using said composite voltage value, said composite current value and said composite speed value.

4. The method of claim 3 further comprising the step of determining whether each motor of said plurality of motors is faulty.

5. The method of claim 4 further comprising the step, in response to said determining step, of classifying the fault associated with said each motor of said plurality of motors.

6. The method of claim 3 further comprising the step of determining whether an additional motor of said common motor type is faulty, said determining step further comprising the steps of:

measuring a plurality of operating signals of said additional motor;

using said plurality of operating signals to solve said first set of discrete state space equations;

comparing said second set of discrete state space equations for said additional motor with said first set of discrete state space equations for said plurality of motors to identify a faulty motor;

measuring, when said additional motor is faulty, the voltage, current and speed of said additional motor;

using said measured voltage, current and speed of said additional motor, comparing each term of said first and second equations to each term of said first and second equations using said composite voltage value, said composite current value and said composite speed value; and identifying at least one fault associated with said additional motor.

7. The method of claim 1 wherein said using step further comprises the step of selecting a threshold limit based on two standard deviations about the mean of the combined plurality of operating signals.

8. A method of testing a plurality of motors of a common motor type where said plurality of motors are in unknown operating condition, said method of testing comprising the steps of:

measuring voltage (V), current (I) and speed ($\omega$) of each of said plurality of motors;

multiplying the measured voltage, current and speed of each motor of said plurality of motors with selected invariants;

for each motor of said plurality of motors, calculating and retaining the result of the discrete state space equations:

$$x(k+1)=Ax(k)+Bu(k)$$

$$y(k)=Cx(k)$$

where x, u, and y represent a state vector, an input vector, and an output vector, respectively, k denotes discrete time increments and A, B, and C are nominal matrices of each of said plurality of said motor;

providing a base model of said plurality of motors;

comparing said discrete state space equations for said base model and said discrete state space equations for each motor of said plurality of motors; and removing from said plurality of motors said each motor of said plurality of motors when said comparing step generates a result that exceeds a threshold.

9. The method of claim 8 further comprising the steps of:
generating a diagnostic model from said plurality of motors; said diagnostic model including physical parameters and a standard deviation associated with each physical parameter; said diagnostic model having a threshold limit associated with each of said physical parameters;
selecting a threshold value for selected physical parameters, said selected physical parameters including an inductance term (L di/dt), a motor resistance term (R i), a motor inertia term (J dω/dt) and motor constants ($k_1$ ωi, $k_2$ $i^2$ f ω), where L, R, J and f denote the inductance, resistance, moment of inertia and friction coefficient of one of said plurality of motors; and
using said measured voltage, said current and said speed, comparing each term of a first equation:

$$L\ di/dt + Ri = V + k_1 \omega i$$

and a second equation:

$$J\ d\omega/dt + f\omega = k_2 i^2 + M$$

with a corresponding term of said diagnostic model;
identifying, if at least one term of said first and second equations exceeds a corresponding one of said threshold limit associated with each of said physical parameters in said diagnostic model, at least one fault associated with the corresponding one of said plurality of motors.

10. The method of claim 9 further comprising displaying the results of said identifying step.

11. The method of claim 9 wherein said identifying step further comprises the steps of:
indicating an imbalanced rotor in response to a change of said L di/dt term in said first equation;
indicating a collector fault in response to a change of said Ri term in said first equation;
indicating a bearing fault in response to oscillatory variation of said L di/dt term in said first equation; and
indicating a bearing fault in response to change of both said L di/dt and said f ω terms in said first and second equations.

12. A method of testing a plurality of motors of a common motor type where said plurality of motors are in an unknown operating condition, said method of testing comprising the steps of:
measuring selected operating parameters of each motor of said plurality of motors;
developing a base model using said measured selected operating parameters, said base model including a residual vector;
determining a solution for discrete state space equations for each motor of said plurality of motors, said discrete state space equations in the form of:

$$x(k+1) = Ax(k) + Bu(k)$$

$$y(k) = Cx(k)$$

where x, u, and y represent a state vector, an input vector, and an output vector, respectively, k denotes discrete time increments and A, B, and C are nominal matrices for each motor of said plurality of said motor; calculating a residual vector associated with each motor of said plurality of motors;
comparing said residual vector associated with each motor of said plurality of motors with said residual vector associated with said base model; and
in response to said calculating and comparing steps, revising said base model using a second plurality of motors, said second plurality of motors comprising fewer motors than said plurality of motors.

13. A model based fault detection and diagnosis method for detecting faults in a plurality of motors of a common motor type and developing diagnostic information for correction of said faults, said method comprising the steps of:
generating a modeled state representation of said plurality of motors, said modeled state representation including a threshold limit derived from said plurality of motors;
measuring operating parameters of each of said motors in said plurality of motors to develop a modeled state representation of each of said motors;
comparing said modeled state representation of said plurality of motors with said modeled state representation of each of said motors in said plurality of motors;
determining whether each of said motors is a faulty motor;
removing from said plurality of motors, in response to said determining step, said faulty motor;
changing said threshold limit of said modeled state representation of said plurality of motors in response to detection of said faulty motor; and
repeating said comparing, determining, removing and changing steps for each of said motors in said plurality of motors.

14. The method of claim 13 further comprising the steps of:
generating a diagnostic model from said plurality of motors, said diagnostic model including physical parameters and a standard deviation associated with each physical parameter, said diagnostic model having a threshold limit associated with each of said physical parameters;
measuring selected physical parameters of each motor in said plurality of motors;
for each motor, comparing each of said selected physical parameters to said diagnostic model; and
for each motor, identifying at least one fault, if at least one of said selected physical parameters exceeds said corresponding physical parameter threshold limit in said diagnostic model.

* * * * *